US006732348B1

(12) United States Patent
Tahoori et al.

(10) Patent No.: US 6,732,348 B1
(45) Date of Patent: May 4, 2004

(54) METHOD FOR LOCATING FAULTS IN A PROGRAMMABLE LOGIC DEVICE

(75) Inventors: Mehdi Baradaran Tahoori, Mountain View, CA (US); Shahin Toutounchi, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 108 days.

(21) Appl. No.: 09/949,253

(22) Filed: Sep. 7, 2001

(51) Int. Cl.$^7$ .............................................. G06F 17/50
(52) U.S. Cl. ....................................... 716/16; 716/18
(58) Field of Search ...................................... 716/16, 18

(56) References Cited

U.S. PATENT DOCUMENTS

| | | | | |
|---|---|---|---|---|
| 5,050,091 A | * | 9/1991 | Rubin .......................... 716/10 |
| 5,105,425 A | * | 4/1992 | Brewer .......................... 714/8 |
| 5,161,157 A | * | 11/1992 | Owen et al. .................... 326/38 |
| 5,349,248 A | * | 9/1994 | Parlour et al. .............. 713/310 |
| 5,498,979 A | * | 3/1996 | Parlour et al. ................. 326/38 |
| 5,508,636 A | * | 4/1996 | Mange et al. .................. 326/38 |
| 5,777,887 A | * | 7/1998 | Marple et al. ................. 716/4 |
| 6,003,150 A | * | 12/1999 | Stroud et al. ................ 714/725 |
| 6,108,806 A | * | 8/2000 | Abramovici et al. ........ 714/725 |
| 6,167,558 A | * | 12/2000 | Trimberger .................... 716/16 |
| 6,181,614 B1 | * | 1/2001 | Aipperspach et al. ........ 365/200 |
| 6,209,118 B1 | * | 3/2001 | LaBerge ........................ 716/1 |
| 6,237,131 B1 | * | 5/2001 | MacArthur et al. ............ 716/16 |
| 6,344,755 B1 | * | 2/2002 | Reddy et al. .................. 326/10 |
| 6,408,402 B1 | * | 6/2002 | Norman ........................ 714/10 |
| 6,470,485 B1 | * | 10/2002 | Cote et al. ..................... 716/16 |
| 6,512,708 B1 | * | 1/2003 | Hsuan et al. ................. 365/200 |
| 6,530,071 B1 | * | 3/2003 | Guccione et al. .............. 716/17 |
| 6,532,579 B2 | * | 3/2003 | Sato et al. ...................... 716/8 |
| 6,539,497 B2 | * | 3/2003 | Swoboda et al. .............. 714/30 |
| 6,564,367 B1 | * | 5/2003 | Fujii et al. ..................... 716/16 |
| 2002/0157071 A1 | * | 10/2002 | Schiefele et al. .............. 716/6 |
| 2002/0166104 A1 | * | 11/2002 | Wu et al. ...................... 716/12 |

FOREIGN PATENT DOCUMENTS

| GB | 2300950 A | * | 11/1996 | ........ H03K/19/1777 |
| JP | 10233677 A | * | 9/1998 | ......... H03K/19/177 |

OTHER PUBLICATIONS

Kelly et al., "Defect tolerant SRAM based FPGAs", Proceedings of IEEE International Conference on Computer Design: VLSI in Computers and Process, Oct. 10, 1994, pp. 479–482.*

Feng et al., "Reconfiguration of one-time programmable FPGAs with faulty logic resources", International Symposium on Defect and Falt Tolerance in VLSI Systems, Nov. 1, 1999, pp. 368–376.*

(List continued on next page.)

*Primary Examiner*—Matthew Smith
*Assistant Examiner*—Phallaka Kik
(74) *Attorney, Agent, or Firm*—H. C. Chan

(57) ABSTRACT

The location of short and open faults in a programmable logic device can be precisely located. The programmable logic device contains a plurality of nets, and each net contains a plurality of PIPs and connected line segments. A faulty net is first identified using conventional methods. A new design is constructed from a faulty net by replacing one of the plurality of line segments or PIPs with an alternative line segment/PIP. The mew design is tested to determine if the fault has been removed as a result of the replacement. If the fault is not removed, another line segment/PIP is replaced. This process is repeated until a design without fault is found. The location of the faulty line segment/PIP can be easily deduced.

20 Claims, 8 Drawing Sheets

OTHER PUBLICATIONS

Roy et al., "On Routability for FPGAs under Faulty Conditions", IEEE Transactions on Computers, vol. 44, No. 11, Nov. 1995, pp. 1296–1305.*

Lach et al., "Enhanced FPGA Reliability Through Efficient Run–Time Fault Reconfiguration", IEEE Transactions on Reliability, vol. 49, No. 3, Sep. 2000, pp. 296–304.*

Howard et al., "The Yield Enhancement of Field–Programmable Gate Arrays", IEEE Transactions on Very Large Scale Integration (VLSI) Systems, vol. 2, No. 1, Mar. 1994, pp. 115–123.*

Hanchek et al., "Design methodologies for tolerating cell interconnect faults in FPGAs", 1996 IEEE International Conference on Computer Design: VLSI in Computers and Process, Oct. 7, 1996, pp. 326–331.*

Mathur et al., "Timing driven placement reconfiguration for fault tolerance and yield enhancement in FPGAs", Proceedings of European Design and Test Conference, Mar. 11, 1996, pp. 165–169.*

Chapman, "FPGA design for decimeter scale integration (DMSI)", 1998 IEEE International Symposium on Defect and Fault Tolerance in VLSI Systems, Nov. 2, 1998, pp. 64–72.*

Lach et al., "Algorithms for efficient runtime fault recovery on diverse FPGA architectures", International Symposium on Defect and Fault Tolerance in VLSI Systems, Nov. 1, 1999, pp. 386–394.*

* cited by examiner

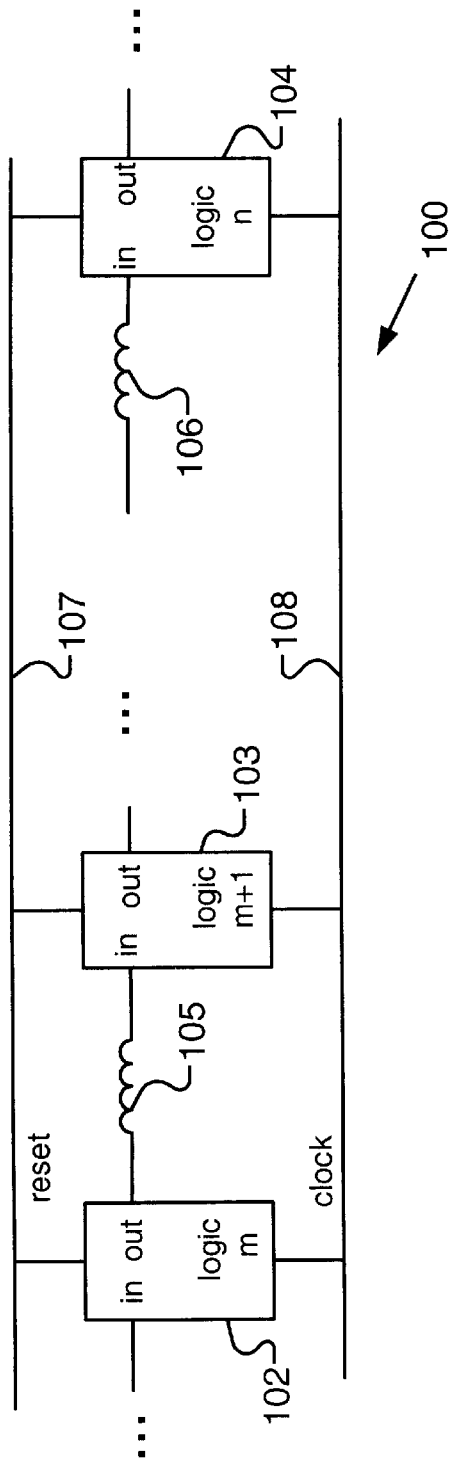
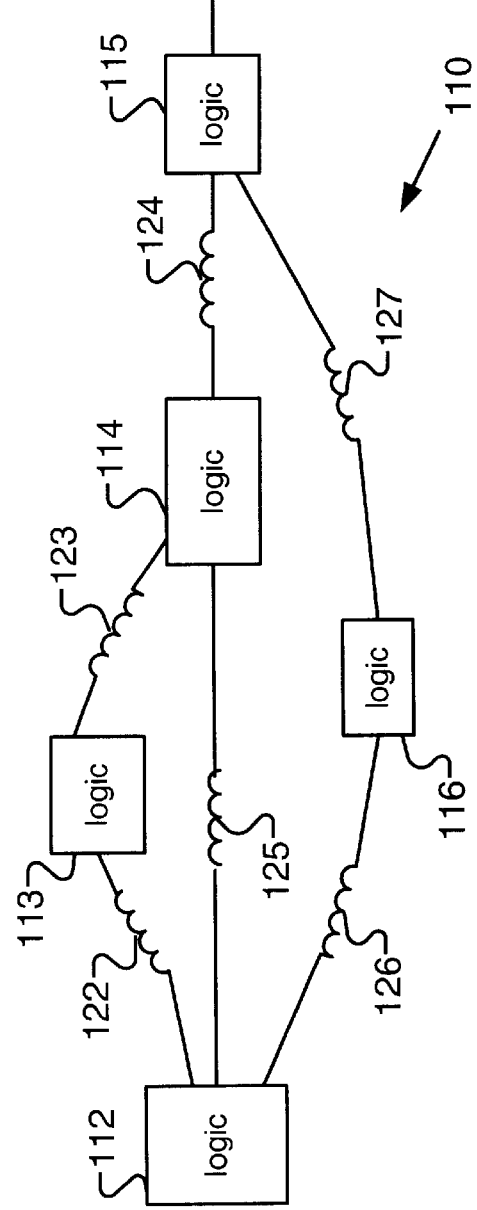
FIG. 1A
FIG. 1B

METHOD FOR LOCATING FAULTS IN A PROGRAMMABLE LOGIC DEVICE

FIELD OF THE INVENTION

This invention relates to faults in integrated circuits, and more specifically to a method for locating faults in programmable logic devices.

BACKGROUND OF THE INVENTION

An important tool for semiconductor yield enhancement is fault localization. Conventional techniques of fault localization are applicable mainly to memory elements because they rely on a direct correspondence of memory address to a specific cell. It should be noted that using memory elements for failure analysis purpose is not limited to stand alone memory devices because many microprocessor or ASIC logic parts have some kind of on chip embedded or cache memory.

The memory cells in most semiconductor devices are built using two to three levels of metal. On the other hand, modern process technologies have more than eight layers of metals. Thus, memory yields are relatively insensitive to defects in higher level metals, thus cannot be relied on for yield enhancement for those levels.

One type of memory rich devices that use many levels of metal is field programmable gate arrays (FPGAs). A FPGA typically includes an array of configurable logic blocks (CLBs) surrounded by a ring of programmable input/output blocks (IOBs). The CLBs and IOBs are interconnected by programmable line segments (such as single length, intermediate length and long interconnect lines) that are controlled by a plurality of programmable interconnection points (PIPs). The CLBs, IOBs, and the PIPs are typically programmed by loading a stream of configuration data (bitstream) into internal configuration memory cells that define how the CLBs, IOBs, and PIPs are configured. The configuration data is typically organized into frames. The configuration bitstream may be read from an external memory (e.g., an external PROM). The collective states of the individual memory cells then determine the function of the FPGA. In addition to configuration memory, many FPGAs also have embedded memories (e.g., LUT RAMs and BLOCK RAMs).

In FPGA, the interconnect resources use all layers of metal. Unlike memories where fault localization is a matter of translating the faulty logical address to its corresponding physical location, interconnect faults do not have such direct correspondence. Thus, it is important to develop a new fault localization technique that can locate faults in multiple metal layers.

SUMMARY OF THE INVENTION

The present invention involves a method for locating faults in a programmable logic device. The programmable logic device contains a plurality of nets, and each net contains a plurality of line segments connected by PIPs. A faulty net (among the plurality of nets) is first identified using conventional methods. In order to locate a fault in a net, a new design is constructed by replacing one of the plurality of line segments or PIPs with an alternative line segment/PIP. The new design is tested to determine if the fault has been removed as a result of the replacement. If the fault is not removed, the previous line segment/PIP is restored, and another line segment/PIP is replaced. This process is repeated until a design without fault is found. The location of the fault should correspond to this line segment/PIP.

This method can be used to locate both open and short faults. In one embodiment of locating short faults, the line segments of two suspected nets may be shorted to each other. The above mentioned new designs are constructed and tested for each net. This allows the faulty line segment of each net to be individually located.

The above summary of the present invention is not intended to describe each disclosed embodiment of the present invention. The figures and detailed description that follow provide additional example embodiments and aspects of the present invention.

BRIEF DESCRIPTION OF THE DRAWINGS

FIG. 1A shows an example of a simple design of the present invention containing logic blocks and nets.

FIG. 1B shows another example of a simple design of the present invention.

DETAILED DESCRIPTION OF THE INVENTION

The present invention relates to fault localization of programmable logic devices. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Digital designs that are implemented in a FPGA are typically synchronous designs. Signals are transferred at each clock tick from one stage of registered logic to the next stage. FIG. 1A shows an example of a simple design 100 that can be implemented in a FPGA. Design 100 comprises a plurality of logic blocks 102–104 connected to each other by nets, such as nets 105 and 106. Each logic block contains an input and an output port. Each logic block is connected to a clock signal line 108. A reset signal line 112 may also be included in design 100.

It should be noted that a design can be more complex than the linear design shown in FIG. 1A. FIG. 1B shows a slightly more complex design 110. It contains a plurality of logic blocks 112–116 connected to each other by a plurality of nets 122–127. In this design, each logic may have several input ports and several output ports. Even more complex designs can be built on a FPGA. The method of the present invention is applicable to both complex and simple designs.

Figure 1C:
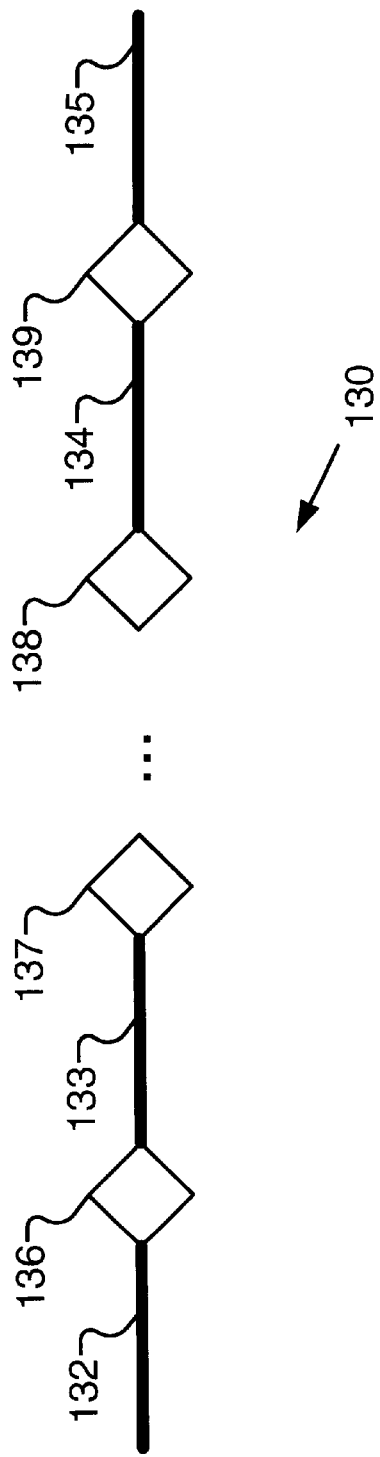
FIG. 1C shows an example of one of the nets in FIG. 1A.
Figure 1D:
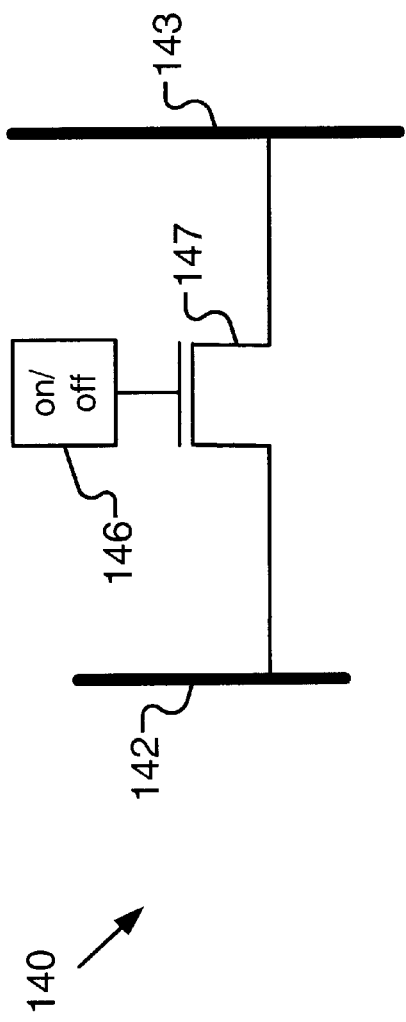
FIG. 1D shows one embodiment of a PIP and line segment of FIG. 1C.

FIG. 1C shows an example 130 of one of the nets in FIGS. 1A and 1B. It contains a plurality of line segments, such as line segments 132–135 linked by a plurality of PIPs, such as PIPs 136–139. In the drawings of the present invention, thick lines are used to show line segments. Note that it is possible for two PIPs to be connected one after another (called "bouncing"). FIG. 1D shows one example of a physical implementation 140 of two line segments (142 and 143) connected by a pass transistor 147. A memory cell 146 is used to turn on or turn off pass transistor 147, thereby connecting or separating line segments 142 and 143. Line segments 142 and 143 may correspond to line segments 132 and 133 of FIG. 1C. Pass transistor 147 and memory cell 146 may correspond to PIP 136 of FIG. 1C.

Figure 2:
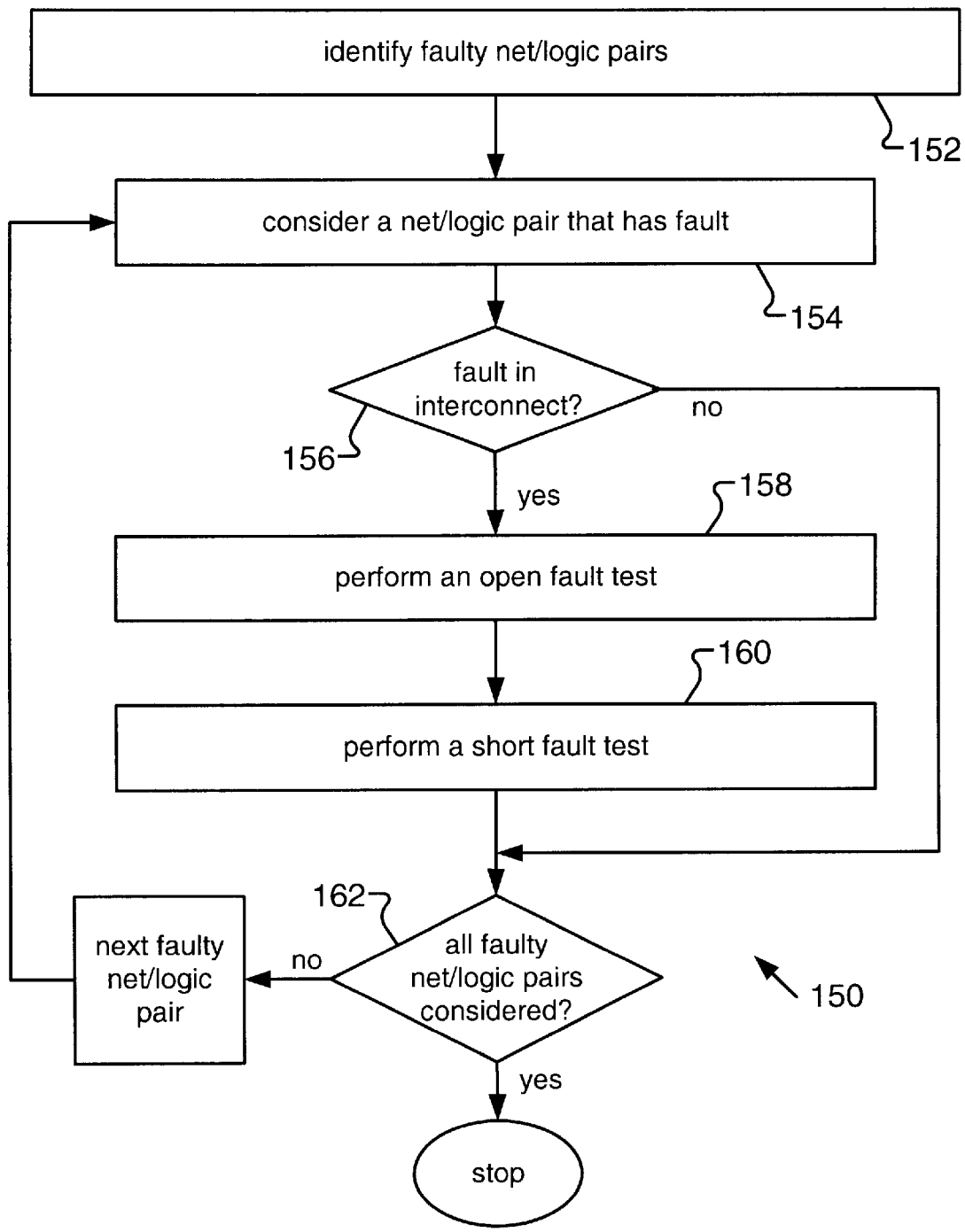
FIG. 2 is a flow chart showing an operation of the present invention.

A flow chart showing an operation 150 of the present invention is shown in FIG. 2. In step 152, operation 150 identifies various net/logic pairs that contain faults. Various well known methods can be used. As an example, an integrated logic analyzer tool named ChipScope, marketed by Xilinx, Inc., can be used to identify faulty net/logic pairs. After the faulty net/logic pairs are identified, these pairs are analyzed one at a time (step 154). In step 156, operation 150 determines whether the fault is in the logic or the interconnect portion of the fault pair. One way to perform this step is to use a readback test. If a faulty pair passes the readback test, the fault is likely to be in the interconnect portion. If the fault is indeed in the interconnect portion, an open fault test is performed (step 158). In step 160, a short fault test is also performed, if there are suspected pairs that contain short faults. The details of these steps will be described below. In step 162, it is determined whether all faulty net/logic pairs have been considered. If all pairs have been considered, operation 150 terminates. If not all pairs have been considered, operation 150 routes back to step 154.

If a faulty pair does not pass the readback test, the fault is in the logic portion, step 156 will then jump to step 162 (i.e., bypassing the open fault and short fault tests). This is because the method of the present invention is not designed to test logic faults.

An open fault testing method is now described. This method is performed after it is determined that a fault may occur at the PIPs in a net or the line segments between those PIPs (based on the result of step 156). In one embodiment, a PIP or a line segment is replaced, one at a time, with an alternative PIP or line segment. This involves many simple designs that are similar to the one illustrated in FIGS. 3A and 3B.

Figure 3A:
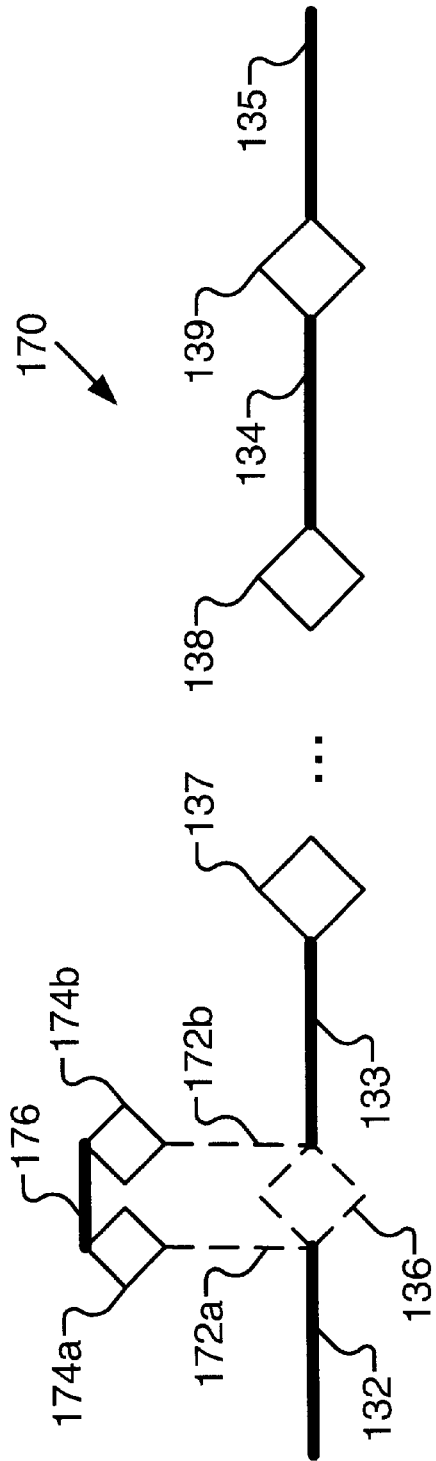
FIG. 3A shows a design of the present invention that can be used to locate open faults in a net.

FIG. 3A shows a net 170 that is a slight modification of net 130 of FIG. 1C. Elements that are common in FIGS. 1C and 3A have the same reference numerals. In FIG. 3A, a PIP 136 is replaced with two PIPs (174a and 174b) and a line segment 176. PIP 136 is shown as dashed line because it is not connected in net 170. Lines 172a and 172b are also shown as dashed because they are not real line segments; they are shown in FIG. 3A to pictorially separating PIPs 136, 174a and 174b so as not to cluster the drawings. In this new design, the original PIP 136 is replaced by an alternative path involving line segment 176 and PIPs 174a, 174b. It should be noted that there are many ways to construct the alternative path (e.g., more than two line segments and more than two PIPs). This replacement can be easily performed by configuring a FPGA. If PIP 136 is the faulty component, the fault will be removed by the replacement.

Figure 3B:
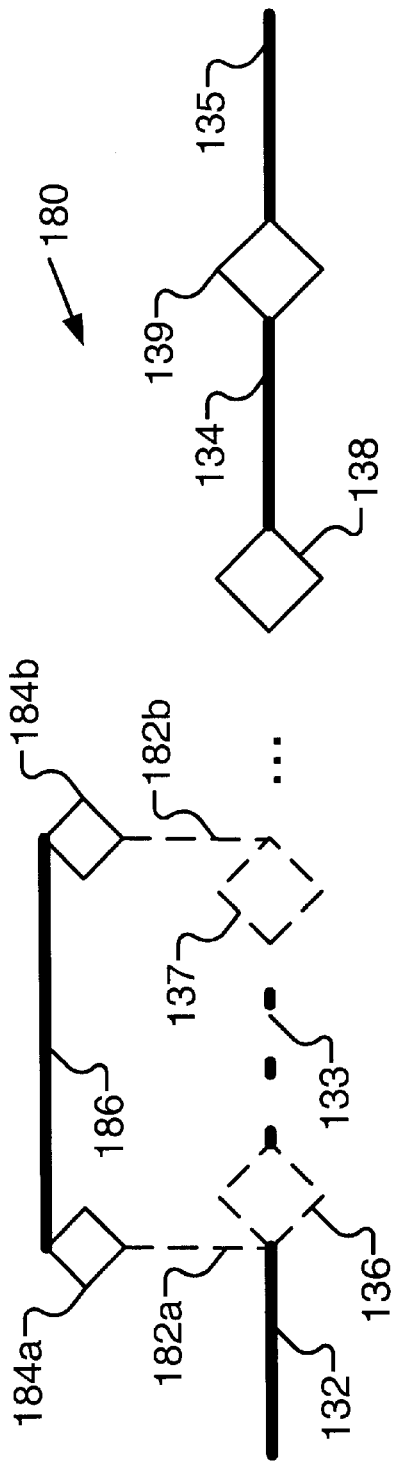
FIG. 3B shows another design of the present invention that can be used to locate open faults in a net.

FIG. 3B shows a net 180 that is a slight modification of net 130 of FIG. 1C. Elements that are common in FIGS. 1C and 3B have the same reference numerals. In FIG. 3B, the intention is to replace line segment 133. One way to do so is to turn off sufficient number of PIPs connected to line segment 133 so that a router will not route any signals through line segment 133. In FIG. 3B, line segment 133 and the two PIPs adjacent thereto (136 and 137) are replaced with two PIPs (184a and 184b) and a line segment 186. PIPs 136, 137 and line segment 133 are shown as dashed line because they is not connected in net 180. Lines 182a and 182b are also shown as dashed because they are not real line segments; they are shown in FIG. 3B to pictorially separating PIPs 136, 137, 174a and 174b so as not to cluster the drawings. It should be noted that there are many ways to construct an alternative path. The replacement shown in FIG. 3B can be easily performed by configuring a FPGA. It is assumed that PIPs 136 and 137 are found to be good using the designs shown in FIG. 3A. If line 133 is the faulty component, the fault will be removed by the replacement.

Designs similar to that shown in FIGS. 3A and 3B are configured so that all the PIPs and line segments in a net are replaced (one new design per replacement). Each configuration is separately tested. By determining failing and non-failing designs, it is easy to deduce the location of the fault.

Figure 4:
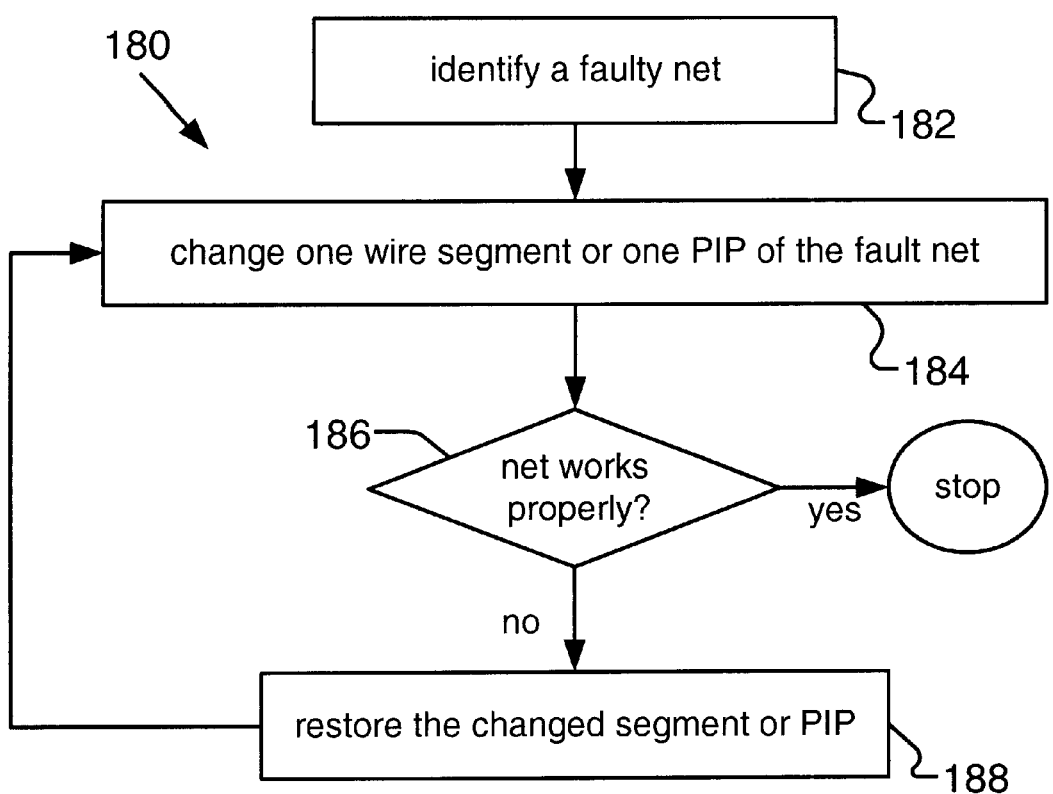
FIG. 4 is a flow chart showing a fault locating method of the present invention.

FIG. 4 is a flow chart showing an open fault testing method 180 of the present invention. In step 182, a faulty net is identified. In step 184, one of the wire segments or PIPs of the faulty stage is replaced with an alternative path. In step 186, the modified net is tested to determine if it now functions properly. If the net is not functioning properly, the replaced wire segment or PIP of step 184 is first restored (step 188). Another wire segment or PIP is then replaced with an alternative path (step 182). If the net is functioning properly in response to the testing under step 186, this wire segment or PIP is the source of the fault. Method 180 now terminates because the fault has been identified.

A short fault testing method is now described. A short involves two nets, and occurs between a routing resource (PIP or line segment) in a first net and one or more routing resources in a second net. The method of locating short faults comprises two steps: in the first step a failing resource in the first pair is located, and in the second step the failing resource in the second pair is located.

Figure 5A:
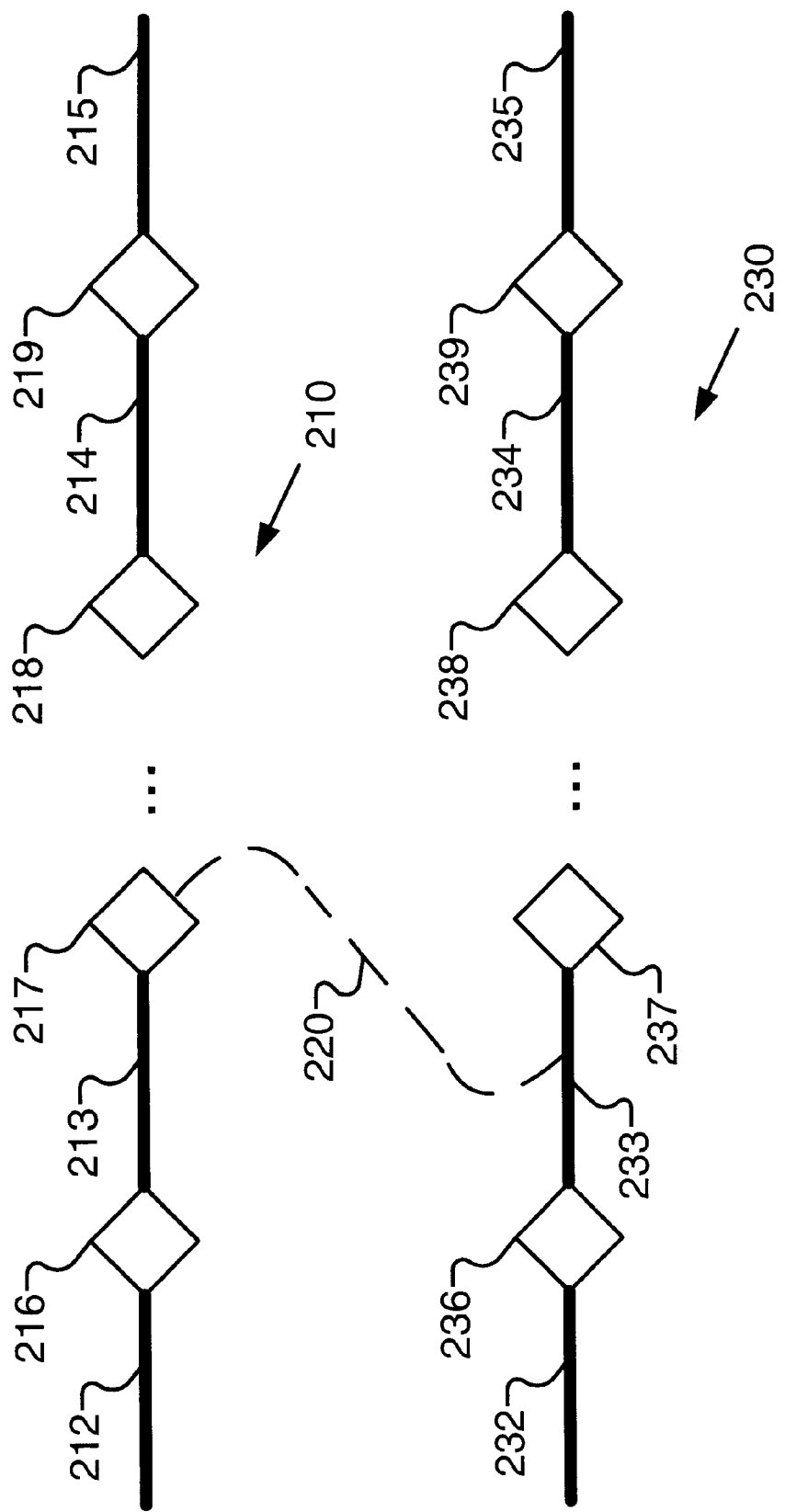
FIG. 5A is a diagram showing two nets of the present invention that may be shorted.

FIG. 5A is a diagram showing two nets that may be shorted. The first net 210 contains a plurality of line segments 212–215 and PIPs 216–219. The second net 230 contains a plurality of line segments 232–235 and PIPs 236–239. FIG. 5A also shows a dashed line 220 connecting PIP 217 and line segment 233 to indicate that there is a short between these two nets. Note that a short can occur between two line segments, two PIPs, and a line segment and a PIP.

Figure 5B:
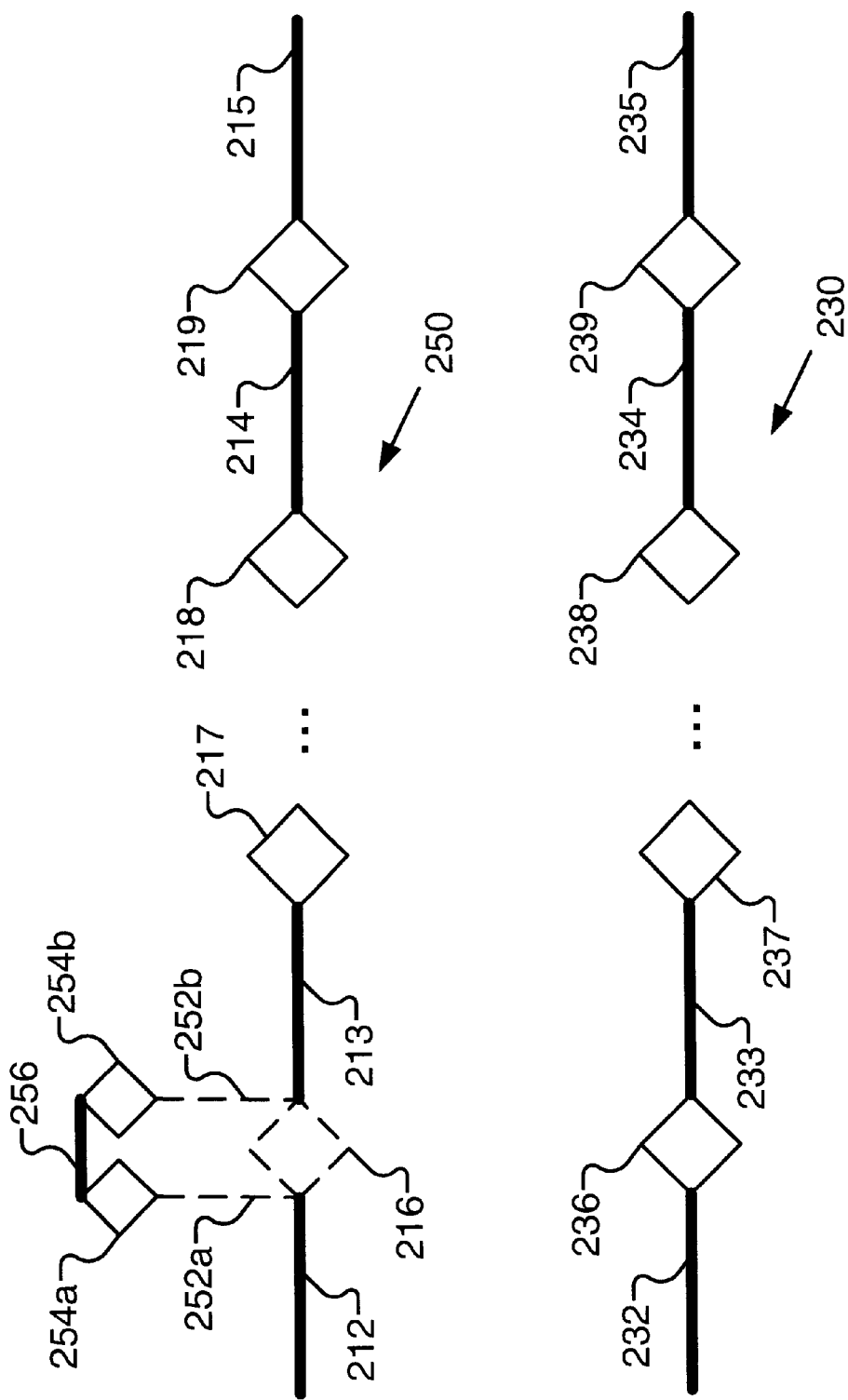
FIG. 5B shows a design of the present invention in which one of the PIPs is replaced.

As part of the process to examine first net 210, a PIP or a line segment of this stage is replaced, one at a time, with another PIP or line segment. FIG. 5B shows a design in which PIP 216 is replaced with two PIPs 252a, 252b, and a line segment 256. The new net is labeled 250. Elements that are common in FIGS. 5A and 5B share the same reference numerals. Thus, in this new design, the original PIP 216 is replaced by an alternative path. This replacement can be easily performed by configuring a FPGA. The meaning of the dashed lines in FIG. 5B is the same as that in FIG. 3A. If there is a short fault in PIP 216, the fault will be removed. Thus, by replacing PIPs or line segments one at a time, it is possible to locate the faulty segment or PIP in stage 210.

Figure 5C:
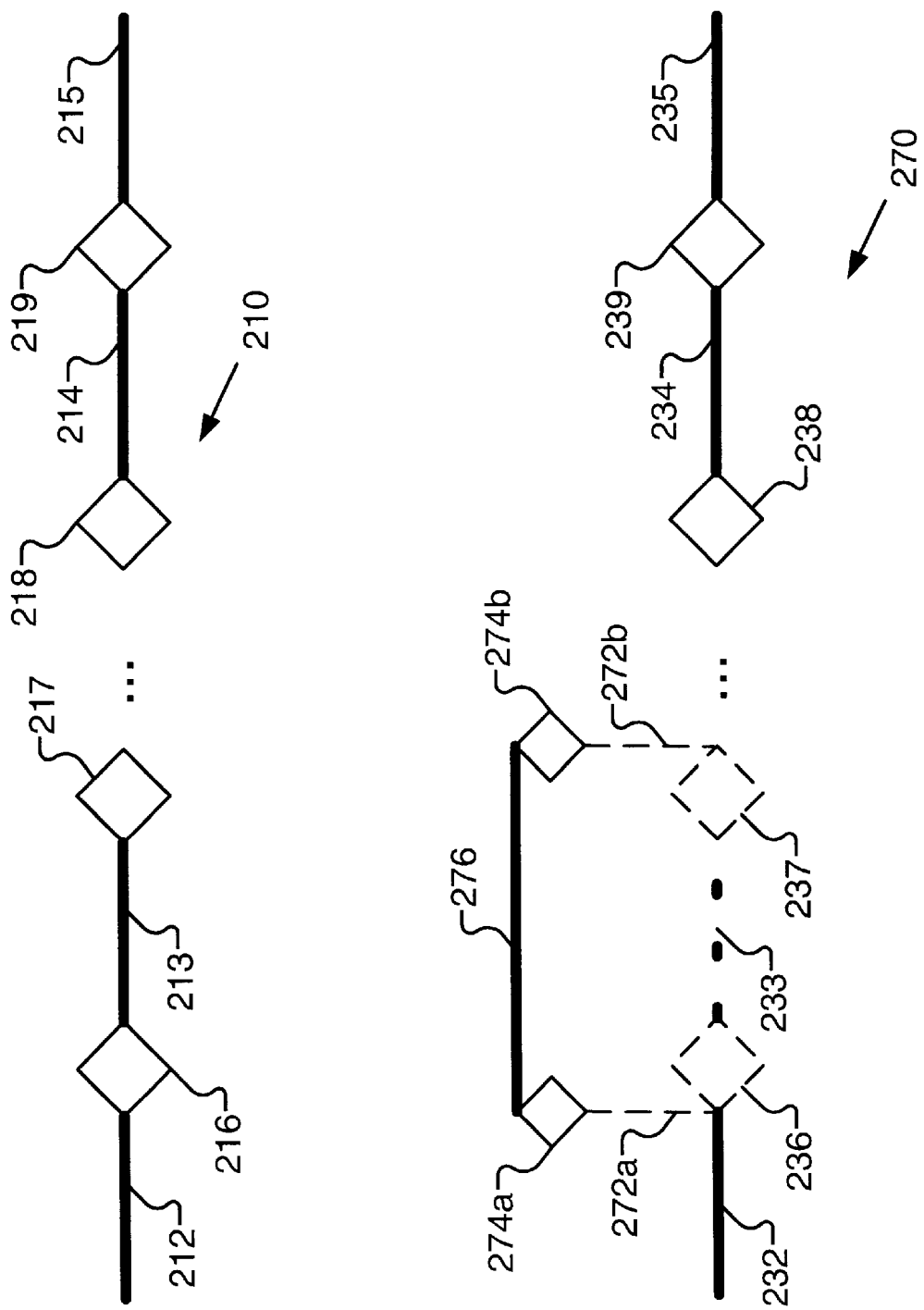
FIG. 5C shows another design of the present invention in which one of the line segments is replaced.

In order to complete the analysis of the short faults, the location of the faulty segment or PIP in stage 230 is performed. Similar to the case of stage 210, a PIP or a line segment of this stage is replaced, one at a time, with another PIP or line segment. FIG. 5C shows a design in which the faulty segment 233 is replaced with a good segment 276. Elements that are common in FIGS. 5A and 5C share the same reference numerals. As explained above, it may be necessary to also replace PIPs 236 and 237 with PIPs 272a and 272b. The replaced net is labeled as 270. This replacement can be easily performed by configuring a FPGA. If there is a short fault in line segment 233, the fault will be removed by replacing it with a good line segment 276. Thus, by replacing PIPs or line segments one at a time, it is possible to locate the faulty segment or PIP in stage 230.

If only one of the suspected nets contains fault, the faulty line segment may be shorted to a different net. In this case, another net may need to be investigated.

One advantage of the present invention is that it is possible to focus on faults on a specific metal layer by building FPGA test configuration designs that use interconnects of a specific type. For example, HEX lines in VirtexII architecture, used in some of the FPGAs marketed by Xilinx, Inc., are mostly in METAL-4. Thus designs that use HEX lines are sensitive to METAL-4 related manufacturing defects. By focusing on designs that use HEX lines, manufacturing defects on METAL-4 can be detected. Consequently, the method of the present invention may serve as a diagnosis tools for specific manufacturing metal layers.

It can be seen from the above description that a novel fault location method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

We claim:

1. A method for locating faults in a programmable logic device, the programmable logic device containing a plurality of nets, each of the nets containing a plurality of routing resources, the method comprising:
 (a) identifying a faulty net that contains a fault, and
 (b) performing the following steps on the faulty net:
 (c) constructing a new design by replacing at least one of the plurality of routing resources with at least one alternative path, wherein each routing resource of the plurality of routing resources is programmable in the programmable logic device a plurality of times;
 (d) determining if the faulty net becomes non-faulty as a result of the alternative path; and
 (e) performing at least the following step if the faulty net remains faulty:
 (f) constructing another design by replacing at least another one of the plurality of routing resources with another alternative path.

2. The method of claim 1 wherein the plurality of routing resources comprise a plurality of programmable interconnection points (PIPs).

3. The method of claim 1 wherein the plurality of routing resources comprise a plurality of line segments.

4. The method of claim 1 wherein the at least one alternative path comprises at least one line segment.

5. The method of claim 1 wherein the at least one alternative path comprises at least one programmable interconnection point ("PIP").

6. The method of claim 1 wherein step (f) further comprises a step of restoring by reprogramming the programmable logic device the at least one of the plurality of routing resources before constructing the another design.

7. The method of claim 1 wherein the new design and the another design use routing resources located on a predetermined metal layer.

8. The method of claim 7 wherein the at least one alternative path comprises at least one line segment.

9. The method of claim 7 wherein the at least one alternative path comprises at least one programmable interconnection point ("PIP").

10. A method for locating faults in a programmable logic device, the programmable logic device containing a plurality of nets, each of the nets containing a plurality of routing resources, the method comprising:
 (a) identifying a first and a second faulty nets;
 (b) performing the following steps on the first faulty net:
 (c) constructing a new design by replacing at least one of the plurality of routing resources with at least one alternative path, wherein each routing resource of the plurality of routing resources is re-programmable in the programmable logic device;
 (d) determining if the first faulty net becomes non-faulty as a result of the alternative path; and
 (e) performing the following steps if the first faulty net remains faulty:
 (f) constructing another design by replacing at least another one of the plurality of routing resources with another alternative path; and
 (g) repeating steps (d) and (e) until the first faulty net becomes non-faulty; and
 (h) performing the following steps on the second faulty net:
 (i) constructing a new design by replacing at least one of the plurality of routing resources with at least one alternative path performed in step (i);
 (j) determining if the second faulty net becomes non-faulty as a result of the alternative path; and
 (k) performing the following steps if the second faulty net remains faulty:
 (l) constructing another design by replacing at least another one of the plurality of routing resources with another alternative path; and
 (m) repeating steps (j) and (k) until the second faulty net becomes non-faulty.

11. The method of claim 10 wherein the plurality of routing resources comprise a plurality of programmable interconnection points ("PIPs").

12. The method of claim 10 wherein the plurality of routing resources comprise a plurality of line segments.

13. The method of claim 10 wherein the alternative path in the first and the second faulty nets comprises at least one line segment.

14. The method of claim 10 wherein each of the alternative paths in the first and the second faulty nets comprises at least one programmable interconnection point ("PIP").

15. The method of claim 10 wherein steps (f) and (l) each further comprise a step of restoring the at least one of the plurality of routing resources by reprogramming the programmable logic device before constructing the another design.

16. The method of claim 10 wherein the new design and the another design of the first and the second faulty nets use routing resources located on a predetermined metal layer.

17. The method of claim 16, wherein the alternative paths of the first and the second faulty nets comprise at least one line segment.

18. The method of claim 16 wherein each of the alternative paths of the first and the second faulty nets, comprises at least one programmable interconnection point ("PIP").

19. The method of claim 1, wherein the fault has an electrical short with respect to operating parameters of the programmable logic device.

20. A method for locating faults in a programmable logic device, the programmable logic device containing a plurality of nets, each of the nets comprising a plurality of line segments connected by programmable interconnection points (PIPs), the method comprising:

identifying a faulty net that contains a fault;

replacing one of the plurality of line segments or PIPs in the faulty net with an alternative line segment or PIP;

determining if the faulty net becomes non-faulty as a result of the replacing; and performing at least the following steps if the faulty net remains faulty:

restoring the one of the plurality of line segments or PIPs by re-programming the programmable logic device; and replacing another one of the plurality of line segments or PIPs with another alternative line segment or PIP.

* * * * *